(12) United States Patent
Yeung et al.

(10) Patent No.: US 9,916,254 B2
(45) Date of Patent: Mar. 13, 2018

(54) ERROR DETECTION USING A LOGICAL ADDRESS KEY

(71) Applicant: SK hynix Inc., Gyeonggi-do (KR)

(72) Inventors: Kwok Wah Yeung, Milpitas, CA (US); Marcus Marrow, San Jose, CA (US); Aditi R. Ganesan, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 149 days.

(21) Appl. No.: 15/171,724

(22) Filed: Jun. 2, 2016

(65) Prior Publication Data

US 2016/0283323 A1    Sep. 29, 2016

Related U.S. Application Data

(62) Division of application No. 14/550,522, filed on Nov. 21, 2014, now Pat. No. 9,384,144.

(60) Provisional application No. 61/970,228, filed on Mar. 25, 2014.

(51) Int. Cl.
| | | |
|---|---|---|
| G06F 12/10 | (2016.01) | |
| G06F 11/10 | (2006.01) | |
| G06F 12/1027 | (2016.01) | |
| G06F 12/1009 | (2016.01) | |
| G11C 29/52 | (2006.01) | |

(52) U.S. Cl.
CPC .......... G06F 12/10 (2013.01); G06F 11/1016 (2013.01); G06F 11/1068 (2013.01); G06F 12/1009 (2013.01); G06F 12/1027 (2013.01); G11C 29/52 (2013.01); *G06F 2212/65* (2013.01)

(58) Field of Classification Search
CPC .............................. G06F 12/10; G06F 12/1027
See application file for complete search history.

(56) References Cited

U.S. PATENT DOCUMENTS

| | | | | |
|---|---|---|---|---|
| 4,373,179 A * | 2/1983 | Katsumata | .......... | G06F 12/1036 711/207 |
| 4,604,688 A * | 8/1986 | Tone | .......... | G06F 12/1475 711/207 |
| 5,517,488 A * | 5/1996 | Miyazaki | .......... | H04L 29/06 370/225 |
| 9,298,472 B2 * | 3/2016 | Kohiga | .......... | G06F 9/4418 |
| 2007/0255924 A1 * | 11/2007 | Moyer | .......... | G06F 12/1027 711/202 |
| 2013/0054934 A1 * | 2/2013 | Mitsugi | .......... | G06F 12/1408 711/203 |
| 2013/0238855 A1 * | 9/2013 | Satran | .......... | G06F 12/0871 711/118 |
| 2013/0250686 A1 * | 9/2013 | Marukame | .......... | G11C 16/08 365/185.12 |
| 2013/0275656 A1 * | 10/2013 | Talagala | .......... | G06F 12/0246 711/103 |
| 2014/0369124 A1 * | 12/2014 | Moon | .......... | G11C 16/16 365/185.11 |

(Continued)

*Primary Examiner* — Joseph D Torres
(74) *Attorney, Agent, or Firm* — IP & T Group LLP (57) ABSTRACT

A logical address key is generated based at least in part on a logical address. Encoded data is generated by systematically error correction encoding the logical address key and write data. One or more physical addresses are determined that correspond to the logical address where the physical addresses that correspond to the logical address are dynamic. At the physical addresses, the encoded data is stored with the logical address key removed.

11 Claims, 5 Drawing Sheets

(56) References Cited

U.S. PATENT DOCUMENTS

2015/0019878 A1* 1/2015 Gammel ................ G06F 12/10
713/190

* cited by examiner

ERROR DETECTION USING A LOGICAL ADDRESS KEY

CROSS REFERENCE TO OTHER APPLICATIONS

This application is a division of U.S. patent application Ser. No. 14/550,522 filed on Nov. 21, 2014, which claims priority to U.S. Provisional Patent Application No. 61/970,228 entitled KEYS FOR ERROR DETECTION filed Mar. 25, 2014. The disclosure of each of the foregoing applications is incorporated herein by reference for all purposes.

BACKGROUND OF THE INVENTION

New types of non-volatile, random-access memories which use solid state storage are being developed. PCRAM is one such type of memory being developed. As with any new technology, there will be new problems which have not been encountered before. Techniques which address these new problems would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
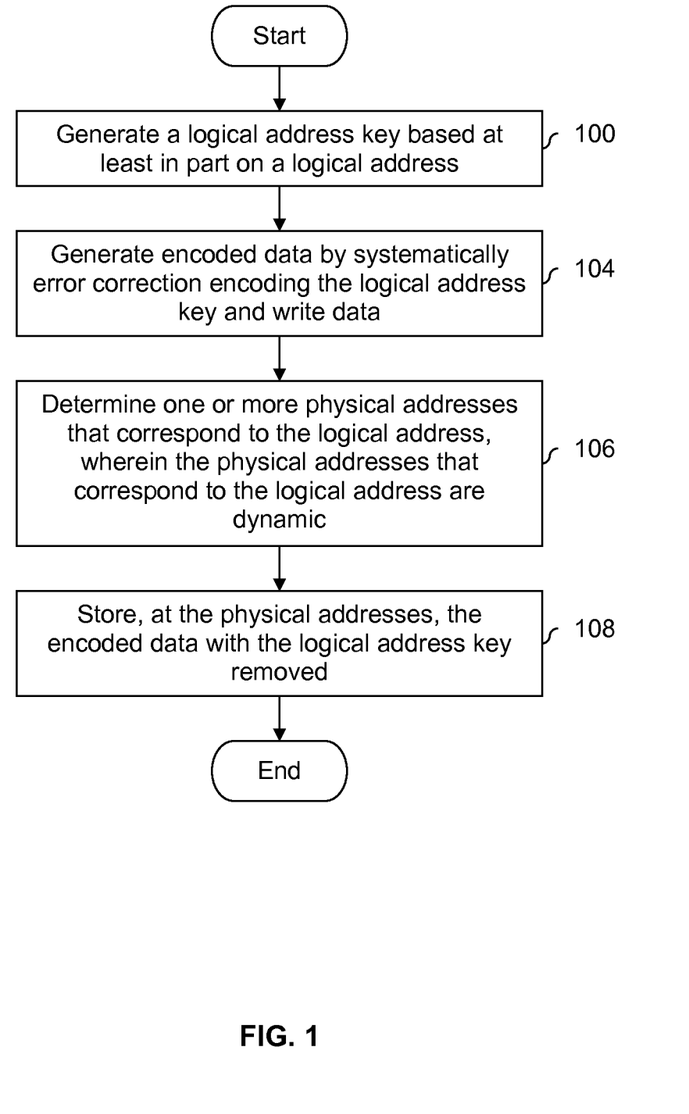
FIG. 1 is a flowchart illustrating an embodiment of a process for storing data in a manner that permits detection of a mapping-related error.

FIG. 1 is a flowchart illustrating an embodiment of a process for storing data in a manner that permits detection of a mapping-related error. In some embodiments, the process is performed by a storage controller which writes data to and reads data from solid state storage (e.g., PCRAM). In some embodiments, a storage controller comprises one chip (i.e., a semiconductor device, such as an application-specific integrated circuit (ASIC) or a field-programmable gate array (FPGA)) and the solid state storage comprises one or more other chips.

In some embodiments, the process of FIG. 1 is performed in response to receiving an instruction to write data to a logical address. For example, the instruction may be received by a storage controller and the instruction may be from a host. In some applications, a host only has knowledge of logical addresses and not physical addresses (e.g., the host knows that data X is stored at logical address Y but does not know what physical address(es) the data is actually located at). In some embodiments, the storage controller is responsible for managing a logical to physical map which is consulted by the storage controller whenever a write instruction or a read instruction is received from the host. In some embodiments, there is a circuit which dynamically determines the logical to physical mapping.

At 100, a logical address key is generated based at least in part on a logical address. In some embodiments, a logical address key is only a few bits long (e.g., 4 bits) so that the error correction capability of a code is mostly directed towards correcting (as/if needed) the payload data (e.g., as opposed to correcting the logical address key). In one example, a logical address key is 32 bits (i.e., 4B) long and includes the lower 32 bits of the logical address.

Using only the logical address when generating the logical address key may result in some logical addresses sharing the same key. In order to reduce this possibility, in some embodiments the logical address key is based on metadata that is received from or otherwise managed by the host in addition to the logical address. For example, some hosts generate a (write) sequence number which the host associates with each logical block. In some such systems, the logical address includes (part of) the logical address and (part of) a sequence number. Note that using metadata is not a requirement and in some cases the logical key address is derived without metadata.

At 104, encoded data is generated by systematically error correction encoding the concatenated logical address key and write data. In systematic error correction encoding, the input data (in this case, the concatenated logical address key and data) is repeated or otherwise included in the output data. In examples shown herein, the concatenated logical address key and data occurs first in the encoded data followed by the parity, but that ordering is merely exemplary and is not intended to be limiting.

At 106, one or more physical addresses that correspond to the logical address are determined, wherein the physical addresses that correspond to the logical address are dynamic.

In one example, information is refreshed in solid state storage by moving the information (i.e., unchanged) from one physical address to another physical address in order to refresh the data. In solid state storage, information is stored in the form of voltage. Nothing is a perfect electrical insulator, including solid state storage, so charge slowly leaks out. As a result, if information is stored for a long period of time in solid state storage, it needs to be refreshed (e.g., by copying the information to a new physical location) so that proper voltage levels can be restored. In that example scenario, the logical address remains the same but the physical address to which it maps changes. This is merely one example scenario and the mapping between logical and physical addresses may change for any number of reasons.

At 108, the encoded data with the logical address key removed is stored at the physical addresses.

Figure 2:
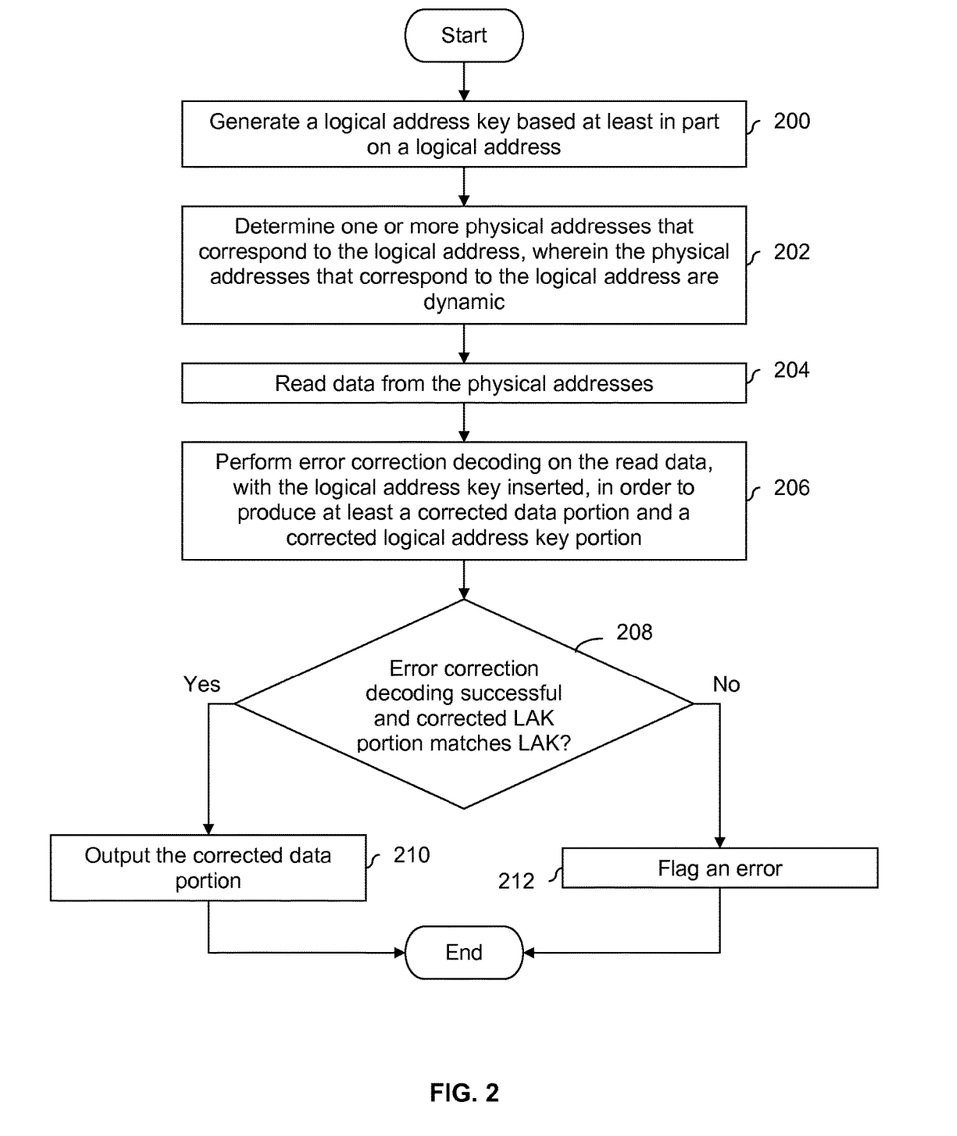
FIG. 2 is a flowchart illustrating an embodiment of a process for reading data, where an erroneous mapping between logical and physical addresses is able to be detected.

FIG. 2 is a flowchart illustrating an embodiment of a process for reading data, where an erroneous mapping between logical and physical addresses is able to be detected. In some embodiments, the process of FIG. 2 is performed by a storage controller and solid state storage is read. In some embodiments the process of FIG. 2 is performed in response to receiving an instruction to read from a logical address. Similar to above, the instruction may be received by a storage controller and/or the instruction may have been issued by a host.

At 200, a logical address key is generated based at least in part on a logical address.

At 202, one or more physical addresses that correspond to the logical address are determined, wherein the physical addresses that correspond to the logical address are dynamic. For example, in solid state storage systems, the address mapping between logical addresses and physical address is dynamic because data may need to be refreshed, causing a change in the physical address but not the logical address.

At 204, data is read from the physical addresses.

At 206, error correction decoding is performed on the read data, with the logical address key inserted, in order to produce at least a corrected data portion and a corrected logical address key portion.

At 208, it is determined if error correction decoding is successful and the corrected logical address key portion matches the logical address key. To put it another way, the decision at 208 is No if either error correction decoding is not successful (because the error correction capability of the code is exceeded because the number of errors contained in the read data, with the logical address key inserted, is greater than the maximum number of bits the code is able to correct), or if the logical address key is corrected (i.e., so that the logical address key before error correction decoding does not match the logical address key after error correction decoding).

If the decision at 208 is Yes, then at 210 the corrected data portion is output. The corrected data portion may include any number of corrections or bit flips as a result of the error correction decoding. If the decision at 208 is No, then at 212 an error is flagged. For example, an error message may be passed up to the host from the storage controller.

In one example, the processes of FIGS. 1 and 2 are employed in a PCRAM system. PCRAM has very small block sizes (e.g., 64 Bytes or 128 Bytes). As a result of the small block size, and the need to store error correction parity information so that error correction decoding can be performed on the read-back data, only a few bits (e.g., 4 bits or 8 bits) can be allocated to catch any logical to physical address mapping errors. To put it another way, allocating more bits to catch any logical to physical address mapping errors reduces the number of bits which can be allocated towards error correction; as a result, only a few bits can be allocated for the first purpose. Other systems with much larger block sizes (e.g., NAND Flash with 512 Bytes or 4 Kbytes block sizes) are able to store the logical address in solid state storage (e.g., in some header that is stored with the encoded codeword in the block), where it can be retrieved and compared at read-back, but this is not feasible for PCRAM systems and other small block systems. The techniques described herein permit some logical to physical address mapping errors to be caught using relatively few bits.

Figure 3:
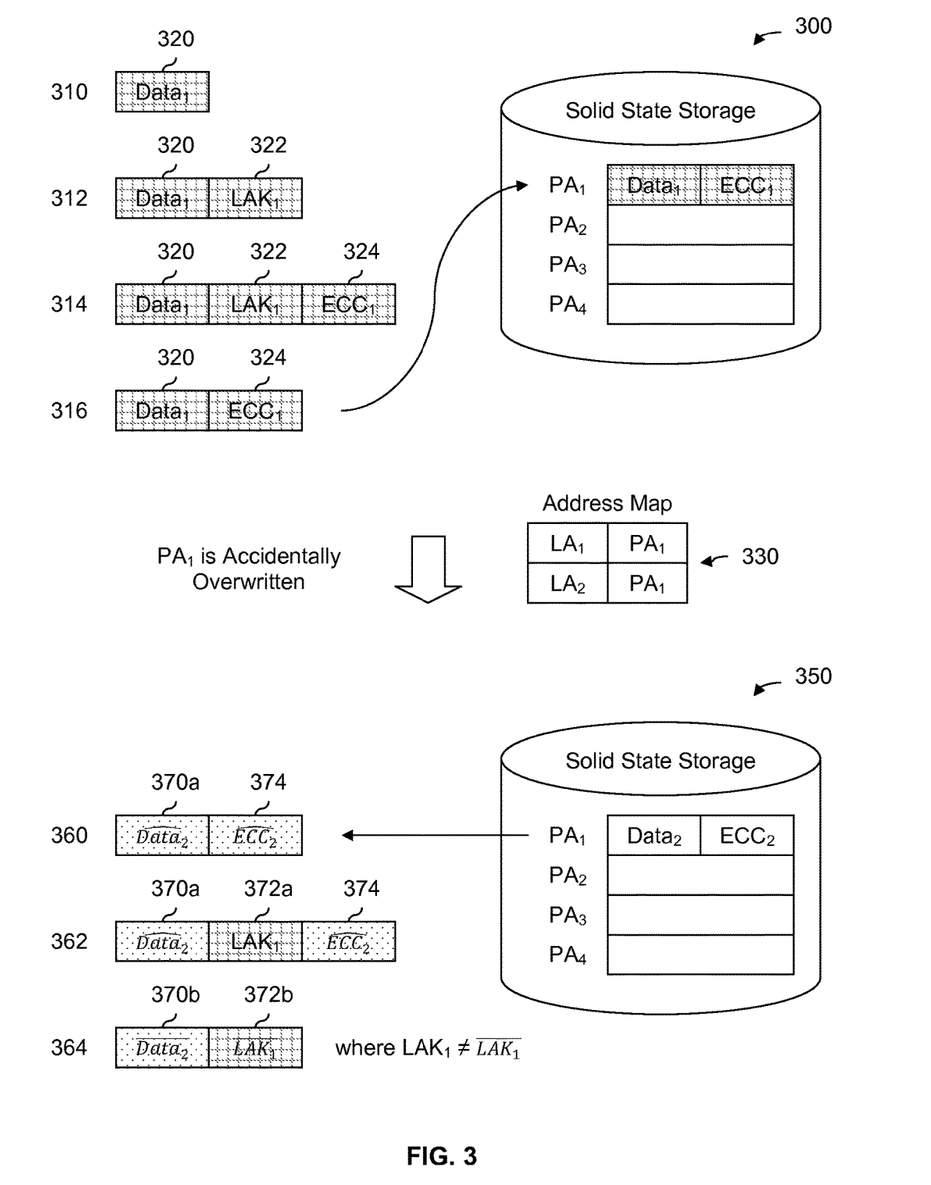
FIG. 3 is a diagram illustrating an embodiment of an error scenario in which data is accidentally overwritten.

The following figure describes an example error scenario which is detected using the read and write processes described above.

FIG. 3 is a diagram illustrating an embodiment of an error scenario in which data is accidentally overwritten. In the example shown, diagram 300 shows data being stored according to the process of FIG. 1.

At 310, write data (320) is received, for example from a host, with an instruction to be written at logical address $LA_1$.

At 312, a logical address key (322) is concatenated to write data (320) where logical address key 322 is generated based on the logical address to which the data is to be written. In this example, write data 320 is first followed by logical address key (322) at 312, but this ordering is merely exemplary and is not intended to be limiting. In some embodiments, the size of logical address key 322 is relatively small compared to write data 320 so that most of the error correction capability of the code is directed towards write data 320 (e.g., 4B for a codeword size of 64B or 128B). Because of the relatively small size of the logical address key, the degradation of the miscorrection rate is negligible.

At 314, write data 320 and logical address key 322 have been systematically error correction encoded, producing write data 320, logical address key 322, and parity 324. Again, the ordering is merely exemplary and is not intended to be limiting.

At 316, logical address key 322 is removed and only write data 320 and parity 324 are stored in solid state storage at physical address $PA_1$. Logical address $LA_1$ corresponds to physical address $PA_1$; this is determined by consulting address map 330. For convenience, a logical address corresponds to a single physical address, but naturally in various embodiments the mapping may be one to many, many to one, or many to many.

At some point in time after write data 320 and parity 324 are stored at physical address $PA_1$, $PA_1$ is accidentally overwritten because of an error in address map 330. Specifically, both logical address $LA_1$ and $LA_2$ in address map 330 map to $PA_1$ which causes $PA_1$ to be accidentally overwritten when data associated with $LA_2$ is received by the storage controller for storage. To illustrate the difference, information associated with the first logical address (i.e., LA0 is shown with a grid pattern and information associated with the second logical address (i.e., $LA_2$) is shown with a dotted pattern.

Diagram 350 shows data being read according to the process of FIG. 2. A read instruction is received to read logical address $LA_1$. In response, physical address $PA_1$ is read and read-back data 370a and read-back parity 374 are obtained at 360. As used herein, a hat (i.e., ^) indicates that a signal or sequence is a read-back signal or sequence and as such may or may not include some errors. Note that the data read back at 360 corresponds to logical address $LA_2$, not logical address $LA_1$ because of the accidental overwrite.

At 362, the logical address key (372a) associated with logical address LA$_1$ is inserted between read-back data 370a and read-back parity 374. Note that logical address key 372a is not shown with a hat since it is not read back from solid state storage. Instead, logical address key 372a is (re) generated from logical address key LA$_1$. In one example, LAK$_1$=f(LA$_1$) where f(·) is a hash function. In another example, f(·) is a function which takes the last four bits of the input.

After error correction decoding read-back data 370a, logical address key 372a, and read-back parity 374, one of two scenarios will occur. In the first scenario, error correction decoding fails because the number of corrections (i.e., bit flips) required to transform read-back data 370a, logical address key 372a, and read-back parity 374 into an allowed codeword is greater than the error correction capability of the code (e.g., 4 bits flips would be required to get to a permitted codeword, but the code has an error correction capability of 3 bits flips). Referring back to FIG. 2, the decision at step 208 would be No because error correction decoding is unsuccessful and thus an error would be flagged at step 212.

The second scenario is shown at 364. In this scenario, the error correction decoding is successful (in the sense that the number of bit flips required to transform read-back data 370a, logical address key 372a, and read-back parity 374 into an allowed codeword is less than the error correction capability of the code), but corrected logical address key 372b does not match logical address key 372a because one or more bits were flipped as a result of error correction decoding. As used herein, a bar (i.e., ) indicates that a signal or sequence is an error corrected signal or sequence. Referring back to FIG. 2, the decision at step 208 would be No because the corrected logical address key (e.g., 372b in FIG. 3) does not match the logical address key (e.g., 372a in FIG. 3) and thus an error would be flagged at step 212.

As such, the exemplary error shown in FIG. 3 would be detected using the read and write processes described above. In contrast, systems which do not use a logical address key in the manner described above are not able to detect the error scenario shown. For example, if the parity is generated using only the (write) data, then read-back data 370a and read-back parity 374 would most likely be able to be corrected to a permitted codeword (without exceeding the error correction capability of the code) and the system would not know that that information is associated with a different logical address and the proper data was accidentally overwritten.

Figure 4:
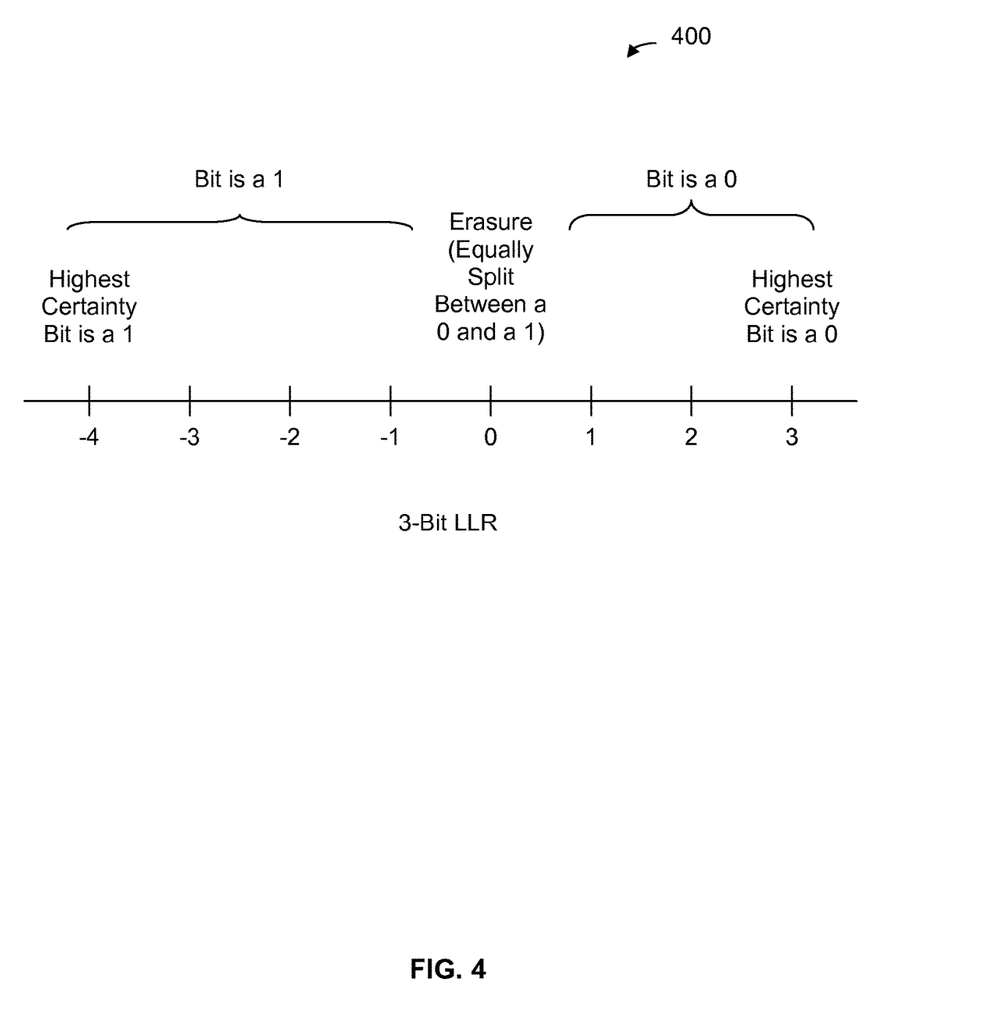
FIG. 4 is a diagram illustrating an embodiment of soft information.

The following figure shows an example of soft information values which may be used for a logical address key when a read process is performed. The logical address key inserted at step 206 in FIG. 2, for example, may use certain prescribed soft information values described below.

FIG. 4 is a diagram illustrating an embodiment of soft information. In some embodiments, a read controller includes a soft-input error correction decoder which takes as its input soft information. In such systems, for example, inputs 370a, 372a, and 374 in FIG. 3 would comprise soft information as opposed to hard information. Hard information only includes a decision (e.g., a certain bit is either a 0 or a 1) with no corresponding certainty or likelihood in those decisions. In contrast, soft information includes both a decision (e.g., a certain bit is either a 0 or a 1) and a certainty (e.g., 95% certainty in a corresponding decision).

Diagram 400 shows 3-bit log-likelihood ratio (LLR) values. LLR values are a type of soft information where the sign (i.e., + or −) indicates the decision. In this example, negative LLR values (i.e., −4, −3, −2, and −1) correspond to a decision that a particular bit is a 1; positive LLR values (i.e., 1, 2, and 3) correspond to a decision that a particular bit is a 1. An LLR value of 0 is referred to as an erasure. In that particular case, there is no decision per se, because it is equally split between a 0 and a 1.

The magnitude of the LLR value indicates the degree of certainty in the corresponding decision, where a larger magnitude indicates more certainty in the corresponding decision. As such, an LLR value of −4 in this example indicates the highest certainty (at least for 3-bit LLR values) in a corresponding decision that a particular bit is a 1. Similarly, an LLR value of 3 in this example indicates the highest certainty in a corresponding decision that a particular bit is a 0. In contrast, a magnitude of 1 (e.g., an LLR of −1 or 1) indicates a relatively low degree of confidence.

Soft-input error correction decoders take into consideration the certainties when making corrections. Bits with low certainties (e.g., low magnitudes in the case of LLR values) tend to be corrected first before bits with high certainties (e.g., high magnitudes in the case of LLR values). The technique described above relies upon (for the later described scenario where error correction decoding is successful) at least one bit being flipped in the logical address key in order for mapping related errors to be detected. As such, in some embodiments where the error correction decoder is a soft-input decoder, a logical address key which is inserted (e.g., between a read-back data portion and a read-back parity portion) is constrained to have certainties which are at a medium or nominal level (e.g., roughly half some highest or maximum magnitude). Using the 3-bit LLR values shown in diagram 400 as an example, a logical address key may (in some embodiments) be constrained or otherwise limited to an LLR value of −2 (for a decision of 1) or 1 (for a decision of 0) because magnitudes of 2 and 1 (respectively) are roughly half the largest magnitude. In some embodiments, any magnitude other than the highest or maximum magnitude is used for a logical address key (e.g., anything other than a magnitude of 4 for negative LLR values or a magnitude of 3 for positive LLR values).

In contrast, if LLR values with the highest certainties (e.g., an LLR of −4 or 3 in the 3-bit LLR case) were used for the logical address key, this may undesirably prevent the soft-input error correction decoder from making any corrections to the logical address key, which in turn would prevent a mapping error from being detected even though an error may have occurred. To put it another way, it is undesirable to unduly and/or unnecessarily prevent a soft-input error correction decoder from making a correction to the logical address key.

Figure 5:
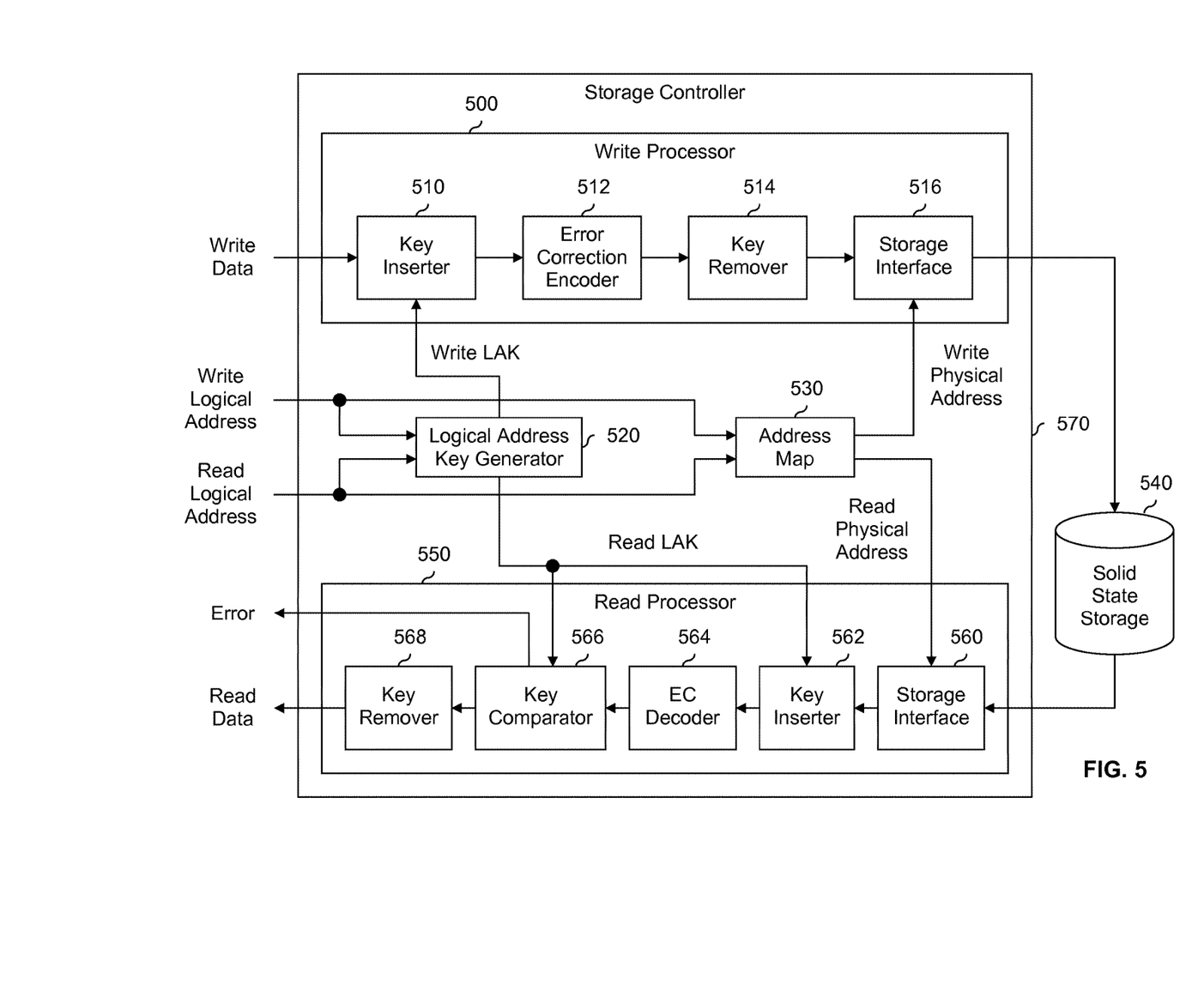
FIG. 5 is a diagram illustrating an embodiment of a system that performs the read and write processes described above.

FIG. 5 is a diagram illustrating an embodiment of a system that performs the read and write processes described above. In some embodiments, storage controller 570 comprises one chip (i.e., semiconductor device) and solid state storage 540 comprises one or more other chips. For readability, some signals are not labeled.

During a write, storage controller 570 receives write data and a write logical address, for example from a host. Logical address key generator 520 generates a write logical address key based on the write logical address. The write logical address key is passed from generator 520 to key inserter 510. Key inserter 510 concatenates the write logical address key and the write data (e.g., by appending the write logical address key to the write data). The concatenated data is then encoded by error correction encoder 512 using a systematic error correction code. The encoded data (e.g., comprising the write data, the write logical address key, and the parity)

is then passed to key remover 514 which strips off the write logical address key, leaving only the write data and the parity.

Using address map 530, a write physical address is determined from the write logical address. For convenience, a 1:1 logical to physical address mapping is used in this example. Storage interface 516 inputs the write physical address, as well as the write data and parity, and stores the write data and parity at the write physical address in solid state storage 540.

During a read, storage controller 570 receives a read logical address. Using address map 530 (which in this example is shared by write processor 500 and read processor 550), a read physical address is determined from the read logical address. Storage interface 560 access solid state storage 540 and reads the read physical address passed to it from address map 530. Storage interface 560 passes the read-back information, which includes a data portion and a parity portion, to key inserter 562. Logical address key generator 520 (which is also shared by write processor 500 and read processor 550) generates a read logical address key based on the read logical address. The read logical address key is passed from generator 520 to key inserter 562 which inserts the read logical address key, for example between the data portion and parity portion of the read-back data. Error correction decoder 564 then performs error correction decoding on the read-back data with the read logical address key inserted.

Key comparator 566 receives both the corrected logical address key from error correction decoder 564 and the read logical address key (e.g., as it was before decoding) from generator 520. If they do not match, or if decoding by error correction decoder 564 is unsuccessful, then key comparator 566 asserts an error flag. If decoding is successful, and the corrected key and the original key match, then the decoded data is passed to key remover 568 which removes the key. The read data (e.g., corresponding to the corrected data portion) is then output by key remover 568.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a logical address key generator configured to generate a logical address key based at least in part on a logical address;
   an address map configured to determine one or more physical addresses that correspond to the logical address, wherein the physical addresses that correspond to the logical address are dynamic;
   a storage interface configured to read data from the physical addresses;
   an error correction decoder configured to perform error correction decoding on the read data, with the logical address key inserted, in order to produce at least a corrected data portion and a corrected logical address key portion;
   a key comparator configured to determine if the corrected logical address key portion matches the logical address key; and
   an interface configured to:
   in the event error correction decoding is successful and the corrected logical address key portion matches the logical address key, output the corrected data portion; and
   in the event error correction decoding is not successful or the corrected logical address key portion does not match the logical address key, flag an error.

2. The system of claim 1, wherein the system includes a semiconductor device, including one or more of the following: an application-specific integrated circuit (ASIC) or a field-programmable gate array (FPGA).

3. The system of claim 1 further comprising solid state storage, wherein the storage interface is further configured to read data from the solid state storage.

4. The system of claim 1, wherein the logical address key is further based at least in part on metadata that is managed by a host.

5. The system of claim 1, wherein:
   the error correction decoder includes a soft-input error correction decoder; and
   the logical address key generator is further configured to generate soft information for the logical address key.

6. The system of claim 5, wherein the logical address key generator generates soft information for the logical address key that does not include a highest certainty.

7. A method, comprising:
   generating a logical address key based at least in part on a logical address;
   determining one or more physical addresses that correspond to the logical address, wherein the physical addresses that correspond to the logical address are dynamic;
   reading data from the physical addresses;
   using an error correction decoder to perform error correction decoding on the read data, with the logical address key inserted, in order to produce at least a corrected data portion and a corrected logical address key portion;
   determining if the corrected logical address key portion matches the logical address key;
   in the event error correction decoding is successful and the corrected logical address key portion matches the logical address key, outputting the corrected data portion; and
   in the event error correction decoding is not successful or the corrected logical address key portion does not match the logical address key, flagging an error.

8. The method of claim 7, wherein the method is performed by a semiconductor device, including one or more of the following: an application-specific integrated circuit (ASIC) or a field-programmable gate array (FPGA).

9. The method of claim 7, wherein the logical address key is further based at least in part on metadata that is managed by a host.

10. The method of claim 7, wherein:
    the error correction decoder includes a soft-input error correction decoder; and
    generating a logical address key includes generating soft information for the logical address key.

11. The method of claim 10, wherein the generated soft information for the logical address key does not include a highest certainty.

* * * * *